United States Patent [19]
Hill et al.

[11] Patent Number: 5,894,648
[45] Date of Patent: Apr. 20, 1999

[54] HIGH SPEED DEPANELING APPARATUS AND METHOD

[75] Inventors: Kurt John Hill, Berthoud; Douglas Patrick Carr, Boulder, both of Colo.

[73] Assignee: Cencorp, Boulder, Colo.

[21] Appl. No.: 08/606,675

[22] Filed: Feb. 26, 1996

[51] Int. Cl.⁶ .............................. B23Q 7/00; B23P 19/00; H05K 3/22
[52] U.S. Cl. .............................. 29/33 P; 29/566.1; 409/132; 409/164; 409/172
[58] Field of Search ...................... 29/33 P, 566.1, 29/791, 563, 564; 409/131, 132, 164, 163, 167, 168, 172, 173; 483/53

[56] References Cited

U.S. PATENT DOCUMENTS

| | | | |
|---|---|---|---|
| 4,657,452 | 4/1987 | Astigiano et al. | 409/190 |
| 4,830,554 | 5/1989 | Lopez | 409/164 |
| 4,985,982 | 1/1991 | Löhr | 29/566.1 |
| 5,067,229 | 11/1991 | Nakamura | 29/566.1 |
| 5,084,952 | 2/1992 | Grabon | 29/33 P |
| 5,117,554 | 6/1992 | Grabow | 29/791 |
| 5,121,539 | 6/1992 | Klingel | 483/53 |
| 5,210,922 | 5/1993 | Carr | 29/426.3 |
| 5,317,943 | 6/1994 | Dowdle | 409/132 X |
| 5,429,461 | 7/1995 | Mukiterjee et al. | 29/33 P |
| 5,438,740 | 8/1995 | Carr et al. | 29/33 P |

*Primary Examiner*—William Briggs
*Attorney, Agent, or Firm*—Duft, Graziano & Forest, P.C.

[57] ABSTRACT

Individual printed circuit boards are routed from a panel comprised of an array of printed circuit boards. The individual printed circuit boards are moved as a group, after being routed from the panel, to a registration nest for holding the individual printed circuit boards. The printed circuit boards rest in the registration nest until a subsequent processing station is ready to receive a printed circuit board. At the appropriate time, each printed circuit board is moved one at a time to a subsequent processing station. A second group of printed circuit boards is routed from a second panel while the first group of printed circuit boards rests in the registration nest and is moved one at a time to the subsequent processing station. A sensor reads features on the panel or on individual printed circuit boards and the routing program is modified or stopped in response to certain panel features.

23 Claims, 5 Drawing Sheets

HIGH SPEED DEPANELING APPARATUS AND METHOD

FIELD OF THE INVENTION

The invention relates to the field of handling multi-board panels containing an array of printed circuit (PC) boards with machinery adapted to depanel or liberate each PC board from the panel. In particular, the invention comprises depaneling machinery which embodies an in-line process in which individual boards are quickly depaneled and delivered to a registration nest. The boards are delivered from the registration nest for subsequent processing by the other automated equipment while the next panel of boards is depaneled.

PROBLEM

There exists a need for high volume and high speed fabrication, assembly and processing of electronics printed circuit boards. PC board assembly involves the insertion and attachment of various electrical components to the PC board by automatic means. A common approach is to assemble multiple PC boards at one time by employing a panel which comprises a plurality of PC boards, such as three. In this way, multiple PC boards are assembled while only a single panel need by handled by the automated assembly equipment. This approach simplifies and speeds up the assembly operation. A critical step in this process is removing the individual PC boards from the panel so they can be further processed or assembled into finished goods such as televisions or other electronic equipment. This operation is referred to as "depaneling" or "liberating" the boards from the panel. The depaneling process must be accomplished with sufficient speed to satisfy the needs of the overall assembly process and must be done in such a way that the electronic components connected to the boards are not damaged.

As the manufacture of electronics based goods becomes more automated, it is common to integrate the PC board depaneling and assembly process into the overall manufacturing line of which the PC boards are a part. As an example, rather than a telephone manufacturing process drawing from an inventory of pre-assembled PC boards, it is common for the telephone assembly line to include a PC board assembly process where, at a point in the process, the just-assembled PC board is inserted into a telephone housing. This has increased the need for PC board assembly equipment, and in particular depaneling equipment, that can maintain a known registration of the depaneled PC boards so that subsequent automated equipment can be programmed to accept the liberated PC boards from a known location and continue the manufacturing process.

Machinery is known that accepts a panel of PC boards and depanels the individual PC boards. U.S. Pat. No. 5,210,922, issued to Carr (1993), is exemplary of an in-line depaneling machine designed for use in a PC board assembly process. In accordance with the Carr patent, panels are delivered to the depaneling machine from a previous step in the assembly process by a conveyer belt. The depaneling machine accepts panels from the conveyer belt and places them onto a table which locates and registers the panels. A router head moves in one axis while the table moves in a second axis allowing PC boards to be cut from the panel by the router bit. In a first embodiment of the Carr invention, the routing head depanels all the PC boards from a panel. The depanelled PC boards are then moved concurrently by a movable arm from the table to a conveyor belt or some other unregistered location at a subsequent processing location. In a second embodiment of the Carr invention, each PC board is cut, sequentially, one at a time from the panel. Each individual PC board is then moved by the movable arm from the table to a conveyer belt or a registered location at a subsequent processing location. A registered location is a location that holds a PC board in a known, programmable position. In both embodiments of the Carr invention, the debris of the depaneling process is transferred by conveyer belt from the depaneling machine.

The apparatus described by Carr is effective for its intended purpose but it is less than ideal in some important respects, especially considering the increased requirements for today's electronics assembly processes. The Carr patent makes no provision for transferring multiple, depaneled PC boards to subsequent automated equipment without slowing the depanelling process. The movable arm described by Carr performs the functions of supporting a panel while the router head operates to cut a PC board from the panel, moving one or more PC boards from the table after depanelling, and moving one or more boards to a subsequent processing station. This means that while the arm described by Carr is occupied with transferring one or more depaneled PC boards to a subsequent processing station, the depaneling process is stopped because the same arm is needed to support the panel during the depanelling process. Therefore, the depanelling process of Carr is idle until the depanelled PC boards are delivered, either concurrently or one at a time, to a subsequent processing station.

Another disadvantage of the Carr invention is the relatively slow speed of his routing process. The router head described by Carr moves only in one axis. Therefore his table must also move in order to accomplish the necessary cuts in a panel to depanel the PC boards. This movement by the table in the Carr invention adds time to the depaneling process. The depaneling machinery described by Carr is also made more complex due to the need to provide servo control of the table.

A further problem with the Carr depanelling equipment is the lack of a flexible and cost-efficient apparatus for verifying certain characteristics of the PC boards to be depanelled. A PC board comprising part of a panel may have been deemed unfit for use at a processing station prior to the depanelling operation and may have been marked as a "bad" board. The depanelling equipment of Carr provides no apparatus for recognizing and processing such "bad" boards.

There exists a need for depaneling equipment that depanels PC boards and controllably arranges the depaneled boards in known, programmable, locations for pick-up by other automated equipment comprising the next step in an industrial process. There also exists a need for a depaneling machine that performs the depaneling operation quickly while achieving the necessary registration of the PC boards for subsequent automated equipment and which disposes of the debris of the depaneling process by removing it from the process line without adding additional time to the machine's through-put time. There exists a further need for board verification system that is flexible and cost-efficient.

SOLUTION

The present invention solves the above identified problems and advances the state of the useful arts by providing apparatus and methods for depaneling PC boards from a panel comprised of an array of PC boards. In particular, this invention is embodied by a depaneling machine having a high through-put which, after depaneling the PC boards, positions the PC boards in known, programmable locations. All of this is accomplished, as well as the disposal of debris, without increasing the through-put time of the depaneling machine. Unlike the prior art machines, the present invention provides a seamless transition in an electronics manufacturing process between handling multiple PC boards at one time in a panel and handling each PC board as an individual unit.

In general, apparatus embodying the present invention includes a depaneler system which cuts all the PC boards from the panel and which maintains a complete 3 axis registration of the depaneled PC boards. The plurality of PC boards cut from the panel are moved concurrently to a registration "nest" in which the PC boards are placed. The registration nest is associated with a registration arm for moving depaneled PC boards, one at a time, to the next station in the assembly process while maintaining 3 axis registration between the PC board and the registration arm. Whereas the movable arm of the prior art performed multiple functions, two arms are provided in the present invention to better optimize the performance of the depaneller system.

A depaneler arm supports the PC boards in a panel while the PC boards are cut from the panel. The depaneler arm transports all the PC boards concurrently from the table, after the routing process, to the registration nest. A registration arm then picks up the PC boards, one at a time, and delivers each PC board, one at a time, to a subsequent processing station.

The registration nest of the present invention provides a platform, or nest, on which all depaneled PC boards of a panel board are concurrently placed after being depanelled from the panel. A registration arm picks up each PC board, one at a time, from the registration nest and moves the PC board to a subsequent processing station. Alternatively, the registration arm can transport the board directly to a location for final assembly of a product and, for example, it can insert the board into a telephone housing piece. The depaneller system operates more efficiently since the depanelled PC boards are held in the registration nest while the depaneller arm returns to the table to begin processing on a new panel. While a new panel is being routed, the registration arm delivers PC boards, one at a time, to a subsequent processing station.

A fixed table of the present invention solves an additional problem of the prior art. When a panel is secured in the table, the depaneler arm fingers move into position over the PC boards in the panel. The fingers grasp each individual PC board. When the PC boards are depaneled, each board is concurrently held by a set of fingers. The panel material that held the individual PC boards together is now debris. In the prior art this debris was handled in various ways. One way was to carry the debris to another location using a conveyer system. This, of course, adds cost and complexity to the depaneler. Another way was to make additional cuts in the debris so that the debris could drop through an opening in the table. This adds time to the process as the router cannot operate on a new panel when it is making cuts in the debris of the previous panel. In the present invention, when the PC boards are depaneled and have been lifted by the depaneler arm, a rail comprising one side of the table is moved to effectively widen the table and cause the debris to drop through a table opening into a waste bin. This operation adds no time to the depaneling process and effectively removes the debris from the work area.

A further advantage of the present invention relates to a board verification system. In a preferred embodiment of the present invention, an optical sensor is attached to the router head assembly and positioned to detect information encoded onto the panel or on a PC board. The router head can be programmed to move to a position to read markings or holes placed on the panel to verify proper orientation or alignment of the panel. In this way, the depaneler system can adjust its operation based on the information read by the board verification system. For example, prior to the panel reaching the depaneler system, a PC board within a panel may fail a certain test. As a result, the PC board is marked, in a prior process, by having a hole punched through the PC board at a certain location. The verification system of the present invention identifies the failed PC board by sensing the hole in the PC board. The depaneler system then does not process the failed PC board but rather allows the failed PC board to be scrapped along with the debris of the depanelling process. Other uses of the verification system include providing a fault signal in the event a panel becomes misaligned in the process or, for example, is upside down. A further advantage of the board verification system is to detect different types of boards. An electronic assembly process may be arranged to process more than one type of board sequentially. In this event, the optic verification system can differentiate between different types of panels as they enter the depaneler and load the appropriate routing program for that type of board to direct the router head.

The above and other features and advantages of the present invention will become apparent from the following description and the attached drawing.

DETAILED DESCRIPTION

FIGS. 1,2,4,5 and 6 depict various views of a depaneller system 100. In order for the reader to better understand the operation of depaneller system 100, a description of a panel 111, with respect to FIG. 3, is first provided.

Panel Description

Figure 3:
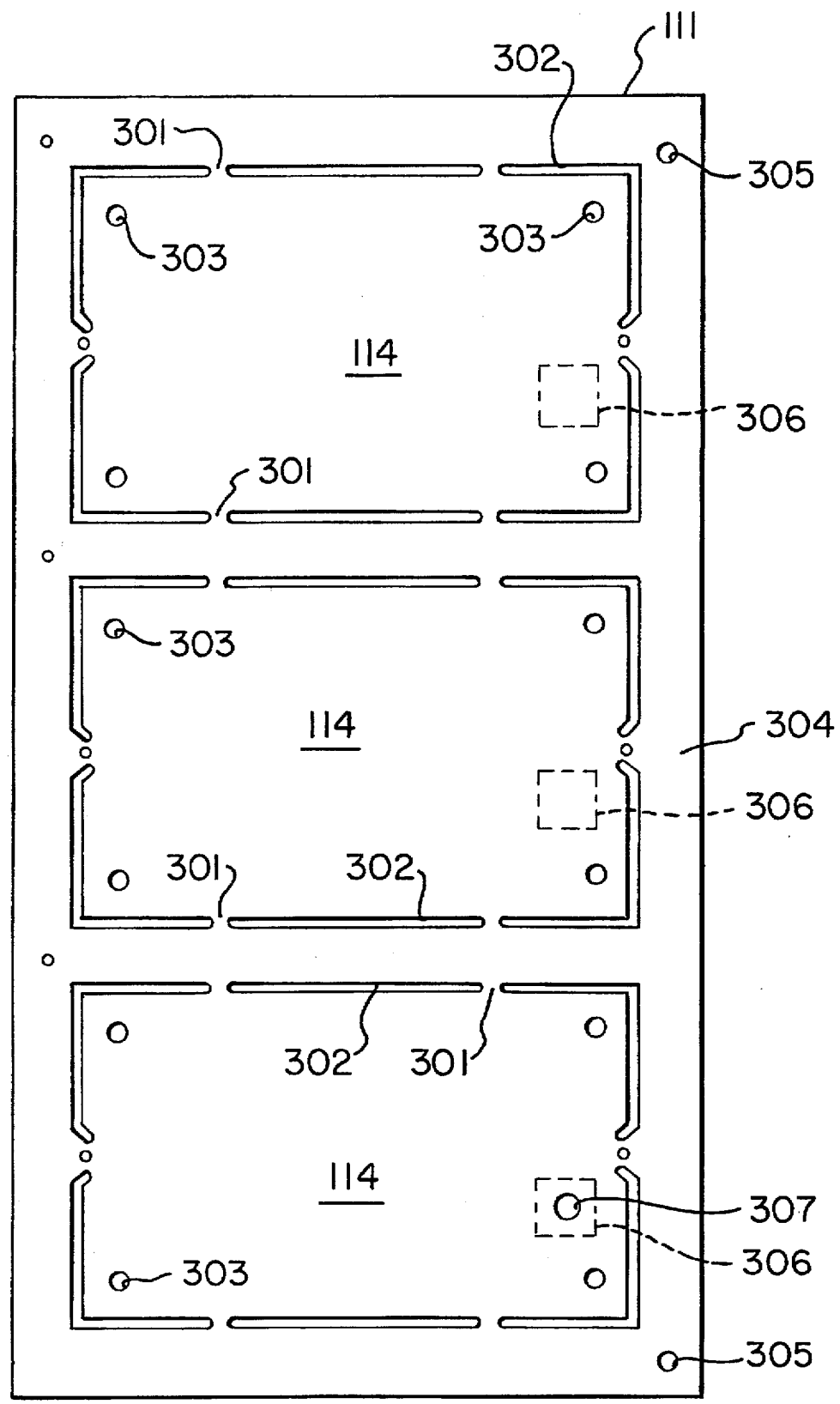
FIG. 3 depicts a panel having interconnected PC boards.

Panel 111 containing 3 PC boards 114 is depicted in FIG. 3. Slots 302 and tabs 301 define the edges of PC boards 114. Tabs 301 connect each PC board 114 to panel 111 and are cut during the depaneling process to release each PC board 114 from panel 111. Registration holes 303 are positioned to mesh with registration nest 205 as described in more detail below. Holes 305 are arranged to mate with tapered pins 171 of positioning assemblies 132 when panel 111 is held in rails 131 and 130, all as described with respect to FIG. 1. Frame 304 is the material of panel 111 that holds each PC board 114 together as a single panel 111. Frame 304 becomes the debris of the depanelling process, as described in more detail below. Three PC boards 114 are described here as exemplary. One skilled in the art will recognize that panel 111 may be comprised of any number of PC boards 114. Panel 111 may not have slots 302 pre-cut as shown in FIG. 3 or may have smaller slots 302 and larger tabs 301.

Overall Operation of Depaneler System

Figure 1:
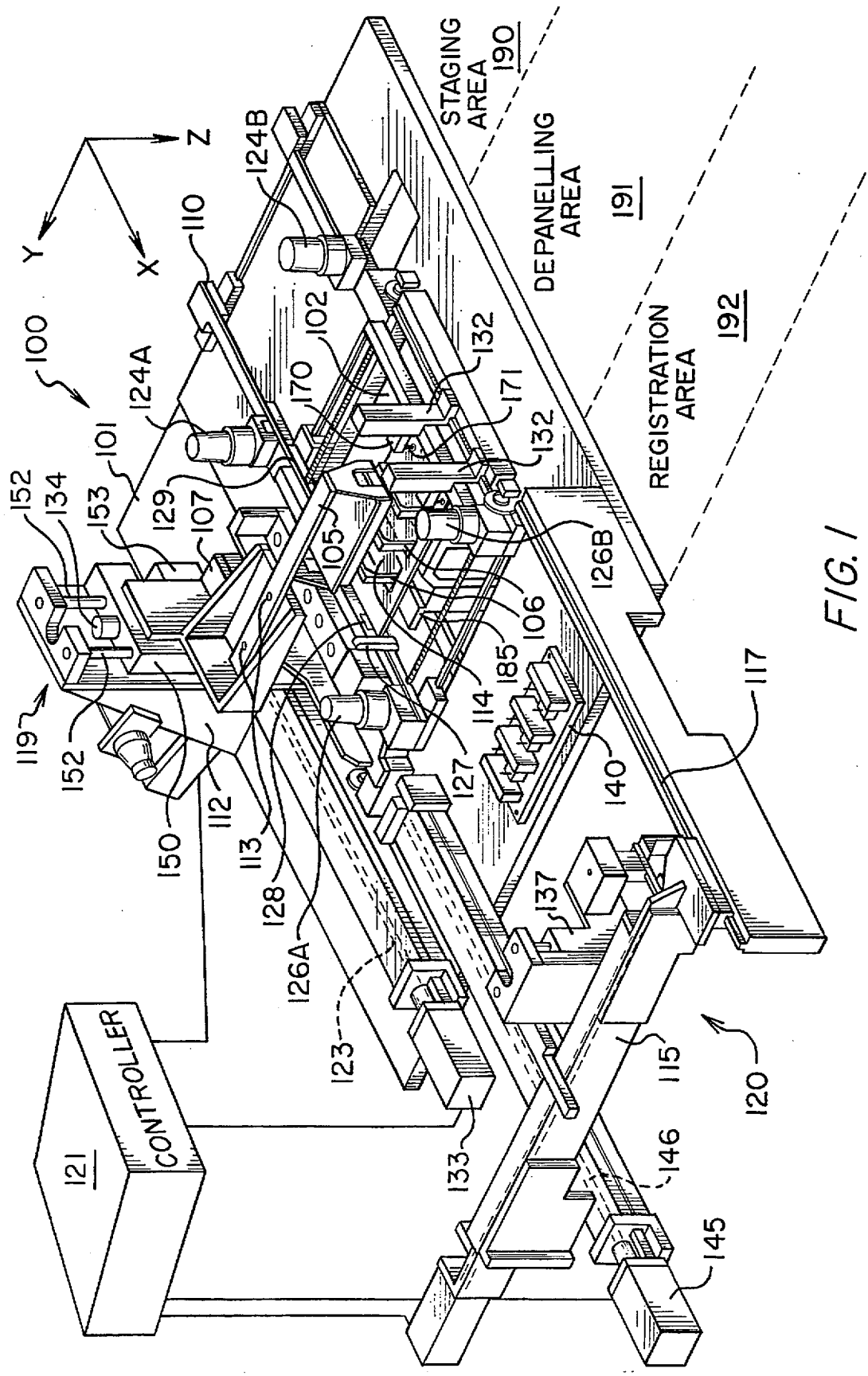
FIG. 1 is a perspective view of the depanelling system of the invention.
Figure 4:
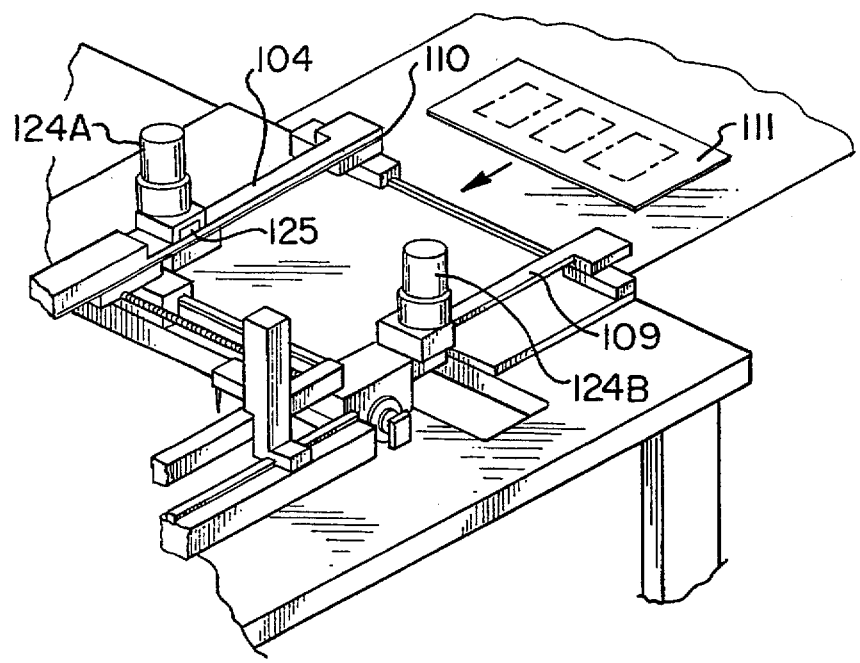
FIG. 4 is a perspective view of the staging area of the depanelling system of FIG. 1.

The basic components and general operation of a depaneling system 100 is described with respect to FIGS. 1 and 4. A panel 111 of interconnected PC boards 114 first enters depanelling system 100 at a staging area 190, shown in FIG. 4. In response to signals from a controller 121, panel 111 is moved from staging area 190 to a depanelling area 191 and held at the position shown in FIG. 1. A router assembly 185, described in more detail with respect to FIG. 2, cuts PC boards 114 from panel 111. A depaneler arm assembly 119 moves the depanelled PC boards 114 concurrently from depanelling area 191 to a registration area 192. From registration area 192, a registration arm assembly 120 moves PC boards 114 one at a time to a subsequent processing station (not shown in FIG. 1).

With reference to FIG. 1, a controller 121 communicates with various motors and sensors, as described below, to coordinate the operations of depaneler system 100. In addition, controller 121 provides diagnostic status information and provides for on-line programming of depaneler system 100. Controller 121 may be an IBM compatible personal computer or similar device. All of the individual connections between controller 121 and the various motors and sensors of depaneler system 100 are not shown as this simplifies the figures. The nature of these connections is understood by those skilled in the art.

Staging Area Operation

On FIG. 4, staging rails 104 and 109 are attached to table 101 and are spaced apart to hold panel 111. Panel 111 is presented to staging rails 104 and 109, as shown in FIG. 4, from a previous processing step (not shown). Panel 111 is moved along staging rails 104 and 109 by conveyors 110. Staging rail 104 and staging rail 109 are each formed with a groove along the edge of the staging rail coincident with the edges of panel 111. Within that groove in each staging rail 104 and 109 is conveyer 110. The conveyor 110 associated with staging rail 109 cannot be seen in FIG. 4. With respect to conveyor 110 associated with staging rail 104, conveyor 110 is a continuous plastic or elastic O-ring which circulates around staging rail 104. Conveyor motor 124a causes conveyor 110 to circulate counterclockwise around the longitudinal axis of staging rail 104. Staging rails 104 and 109 are spaced apart so that conveyors 110 contact panel 111 and to move it in the direction indicated by the arrow in FIG. 4. Conveyor motor 124b drives a similar conveyor 110 associated with staging rail 109. Conveyor motors 124a and 124b operate in response to signals from controller 121 and, depending on the signals from controller 121, can move conveyors 110 in either direction.

Figure 5:
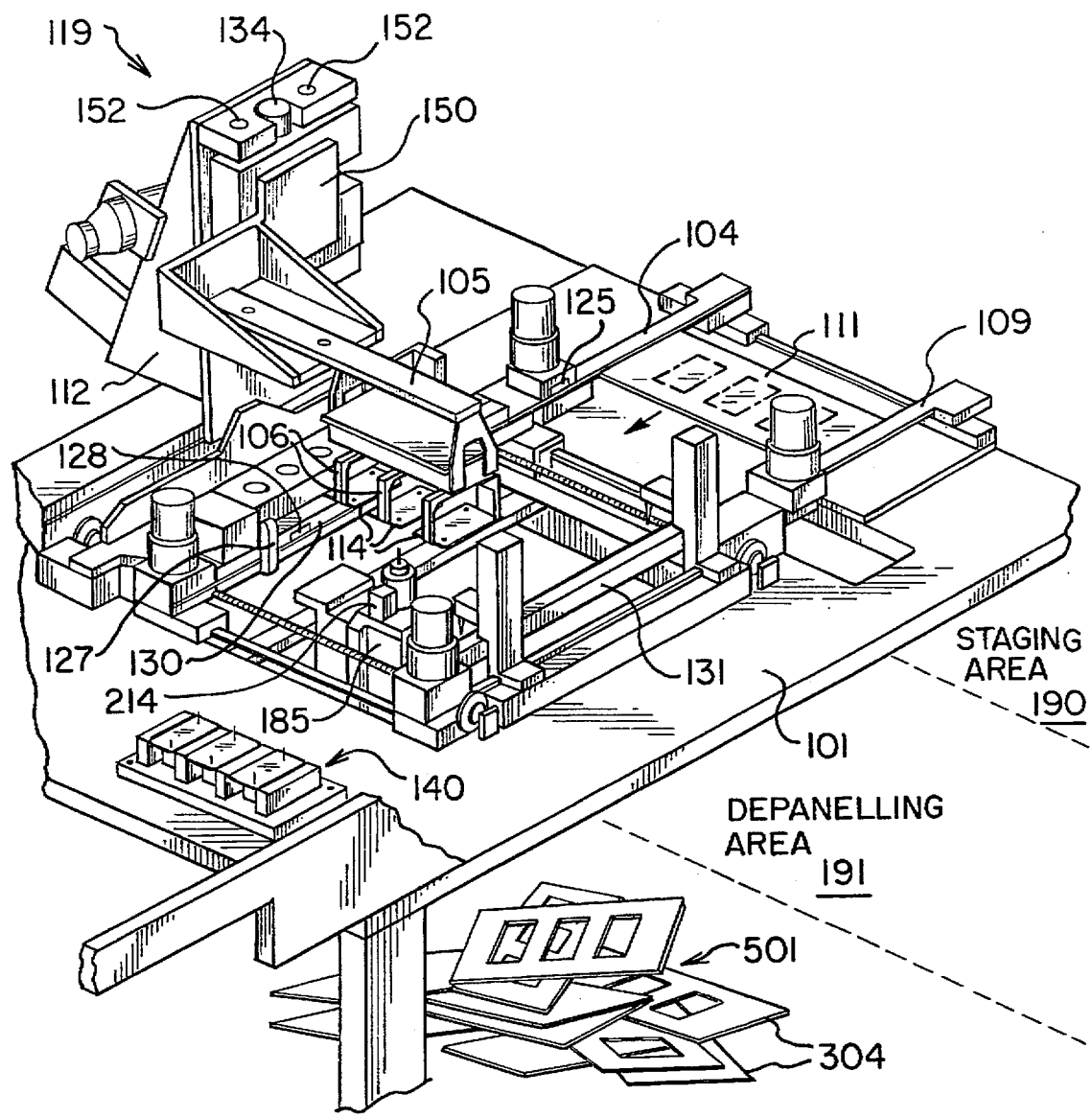
FIG. 5 is a perspective view of the depanelling system of FIG. 1 excluding the registration arm assembly.

Conveyor motors 124a-b drive conveyors 110 to move panel 111 from an entry position, shown in FIG. 4, at one side of depaneler table 101 along staging rails 104 and 109 until panel 111's presence is detected by staging detector 125. FIG. 5 depicts panel 111 engaged by staging rails 104 and 109 and moving towards staging detector 125. Staging detector 125 is a proximity detector that senses the presence of panel 111. Staging detector 125 communicates a signal to controller 121 when panel 111 is moved to a position in staging rails 104 and 109 adjacent to staging detector 125. Controller 121, responsive to a signal from staging detector 125, sends a signal to conveyor motors 124a-b to cause conveyor motors 124a-b to stop. In this way, conveyors 110 stop moving when panel 111 reaches a position along staging rails 104 and 109 adjacent to staging detector 125.

On FIG. 1, panel 111 is held in staging area 190 until controller 121 communicates signals to move panel 111 from staging area 190 into depanelling area 191. Depaneler rails 130 and 131 are spaced apart similarly to staging rails 104 and 109 in order to accept panel 111 from staging area 190. Depaneler rail 130 and 131 are formed in similar fashion to staging rails 104 and 109 in that each has a groove formed on its surface coincident with panel 111. In the groove is conveyor 129 which is a continuous rubber or elastic O-ring. Conveyors 129 are caused to move by the operation of conveyor motor 126a associated with depaneler rail 130 and conveyor motor 126b associated with depaneler rail 131.

When it is time to move panel 111 from staging area 190 to depanelling area 191, controller 121 communicates signals to conveyor motors 124a and 124b to cause conveyors 110 to operate. The operation of conveyors 110 causes panel 111 to be moved from staging area 190 towards rails 130 and 131 in depanelling area 191. At about the same time, controller 121 communicates signals to conveyor motors 126a-b to cause conveyors 129 to move along depaneler rails 130 and 131. The motion of conveyors 110 moves panel 111 from staging area 190 into contract with conveyors 129. Conveyors 129 move panel 111 from the staging area to depanelling area 191.

Depanelling Area Description

The motion of conveyors 129 moves panel 111 along depaneler rails 130 and 131 until panel 111 contacts panel stop element 127. Detector 528, shown in FIG. 5 adjacent stop element 127 senses the presence of panel 111 and sends a signal to controller 121. Controller 121, responsive to a signal from detector 528, sends signals to motors 126a-b to stop conveyors 129. Panel 111 is now in the position shown in FIG. 1. When conveyors 129 are stopped, controller 121 communicates signals to a pair of positioning assemblies 132. Each positioning assembly 132 has a bar 170 and tapered pin 171. Signals from controller 121 cause pneumatic cylinders (not shown) in positioning assemblies 132 to lower bars 170 down toward panel 111. Tapered pins 171 mate with holes 305 in panel 111 to hold panel 111 in a fixed position. Whereas stop element 127 positions panel 111 relatively close to the desired location with respect to the X-Y axes, tapered pins 171 precisely position panel 111 for the routing process.

With panel 111 precisely positioned by tapered pins 171, panel 111 is clamped in place as follows for the routing process. Rails 130 and 131 have associated with them rail clamps 138 and 139, respectively. Referring to rail 130, rail clamp 138 rests on top of rail 130. In response to signals from controller 121, pneumatic cylinders (not shown) between rail 130 and rail clamp 138 cause rail clamp 138 to move downward clamping panel 111 between rail clamp 138 and rail 130. Operation of rail clamp 139 and with respect to rail 131 and panel 111 is similarly described.

When panel 111 is held by rail clamps 138 and 139 in rails 130 and 131, fingers 106 of arm 105 grip individual PC boards 114 in order that router assembly 185 can operate to separate PC boards 114 from panel 111. Fingers 106 are part of depaneler arm 105. Depaneler arm assembly 119 comprises depaneler arm tower 112, depaneler arm support 150, and depaneler arm 105. Depaneler arm 105 is connected to depaneler arm support 150 by bolts 113. Precise positioning of depaneler arm 105 with respect to depaneler arm support 150 is established with locating pins (not shown) on depaneller arm support 150 which mate with holes (not shown) on depaneler arm 105. Bolts 113 are provided so that a user can process panels 111 of different designs by removing depaneler arm 105 and replacing it with depaneler arm 105 having a different configuration. Depaneler arm support 150 is slidably connected to depaneler tower 112 through guides 152. In response to signals from controller 121, pneumatic cylinder 134 (FIG. 2) moves depaneler arm support 150 in the Z axis. Depaneler arm support 150 moves up and down along guides 152 as pneumatic cylinder 134 operates in response to signals from controller 121. Depaneler fingers 106 are connected to depaneler arm 105. A solenoid (not shown) operates, in response to signals from controller 121 to cause each pair of fingers 106 to grasp PC board 114.

Depaneler tower 112 has base 153 which is slidably connected to guide 107. Depaneler arm assembly 119 moves in the X axis, along guide 107, by the operation of motor 133 and lead screw 123. Lead screw 123 is connected to motor 133 so that when motor 133 operates, lead screw 123 is turned. Lead screw 123 cooperates with base 153 of depaneler tower 112 such that when lead screw 123 is turned by motor 133, depaneler tower 112 is caused to move in the X axis along guide 107.

With reference to FIG. 1, the process of routing PC boards 114 from panel 111 is initiated after panel 111 is held in tracks 130 and 131 by rail clamps 138 and 139 and supported from above by fingers 106. Fingers 106 support panel 111 when controller 121 sends signals to drive motor 133. Operation of motor 133 causes depaneler arm assembly 119 to move along guide 107 so that fingers 106 are directly above panel 111. Signals communicated from controller 121 to pneumatic cylinder 134 cause depaneller arm 105 to move downward until depaneler fingers 106 are inserted into slots 302 in panel 111. Controller 121 sends signals to the solenoids for each pair of fingers 106 to cause fingers 106 to close and grasp panel 111. This is the state of depaneler system 100 shown in FIG. 1.

Description of the Routing Process

The apparatus of router assembly 185 is described with reference to FIG. 2. Router assembly 185 is mounted below table 101. Depaneler arm assembly 119 and registration arm assembly 120 are positioned on top of table 101. Router assembly 185 can move in all three axes. Pneumatic cylinder 210 operates, in response to signals from controller 121, to cause router head 215 to move up and down in the Z axis. A motor 211 receives signals from controller 121 and, in response, drives lead screw 212 to cause router head 215 to move in the X direction. Motor 211, lead screw 212 and router head 215 are mounted on frame 216. Motor 213 is connected to a lead screw (not shown) to move frame 216, and router head 215, in the Y direction in response to signals from controller 121.

Controller 121 sends signals to motors 211 and 213 to position router head 215 for the routing process. Pneumatic cylinder 210, in response to signals from controller 121, moves router head 215 upward in the Z axis so that router bit 202 engages panel 111 through one of slots 302 in panel 111. Router head 215 is moved in a programmed pattern, responsive to signals from controller 121 as just described, to cut each of tabs 301 which connect PC boards 114 to panel 111. As mentioned above with respect to FIG. 3, panel 111 may instead have no slots 302. In this event, router bit 202, in response to signals from controller 121, must drill a hole in panel 111 in order to rout a slot 302 to depanel PC boards 114 from panel 111.

Removal of PC Boards from Depanelling Area to Registration Area

With reference to FIGS. 1, 3 and 5, when all of tabs 301 have been cut by router bit 202, controller 121 sends signals to operate pneumatic cylinder 134 in order to raise depaneler arm 105. Individual PC boards 114, grasped by fingers 106, are thereby lifted as a group from rails 130 and 131. Controller 121 sends signals to motor 133 to drive lead screw 123 and cause depaneler arm assembly 119 to move in the X direction towards the registration area 192 of depanelling system 100. Controller 121 then sends signals to release panel 111 by releasing rail clamps 138 and 139 and to raise tapered pins 171 from panel 111.

Disposal of Debris

Frame 304 of panel 111 is still resting in rails 130 and 131. Frame 304 is no longer needed and, through the following operation of depaneler system 100 described with reference to FIG. 5, is removed from the process. Panel frame 304 is comprised of what is left of panel 111 when tabs 301 have been cut and PC boards 114 removed from panel 111. Solenoids (not shown), connected to rail 130 and depaneler table 101, receive signals from controller 121 to cause rail 130 to move slightly in the Y axis away from rail 131. Controller 121 sends signals to the solenoids to cause this Y axis movement of rail 130 after PC boards have been lifted as a group by depaneler arm 105. The movement of rail 130 increases the distance between rails 130 and 131 and causes frame 304 to drop through a hole in table 101 into waste bin 501. In this way, frame 304, the debris of the depaneling process, is removed from the process without adding any extra time to the depanelling process or requiring the manual removal of the debris.

Also note that in FIG. 5, the depanelled PC boards 114 are held by fingers 106 of depaneler arm assembly 119 as depaneler arm assembly 119 transports PC boards 114 to place them in registration nest 140 as described below. Another panel 111 is presently in staging area 190 between rails 104 and 109. As soon as PC boards 114 are moved from between rails 130 and 131 and frame 304 has been dropped into waste bin 501, controller 121 sends signals to motors 124a-b and 126a-b to bring panel 111 of FIG. 5 from staging rails 104 and 109 to rails 130 and 131.

Deposit of PC Boards in Registration Area

Registration nest 140 is described with reference to FIG. 6. Registration nest 140 has base 601 which is removably attached to table 101 through pins 604. Compartments 602 are formed so that each compartment 602 receives one PC board 114. Each compartment has locator pins 603 which mate with holes 303 in PC boards 114 (shown in FIG. 3). Registration nest 140 is uniquely configured for each different application of depaneler system 100 and is therefore provided with pins 604 to allow various different configurations of registration nest 140 to be attached to table 101 for various different applications. An example of a different configuration for panel 111 is a panel 111 containing 4 PC boards rather than 3 PC boards.

Figure 6:
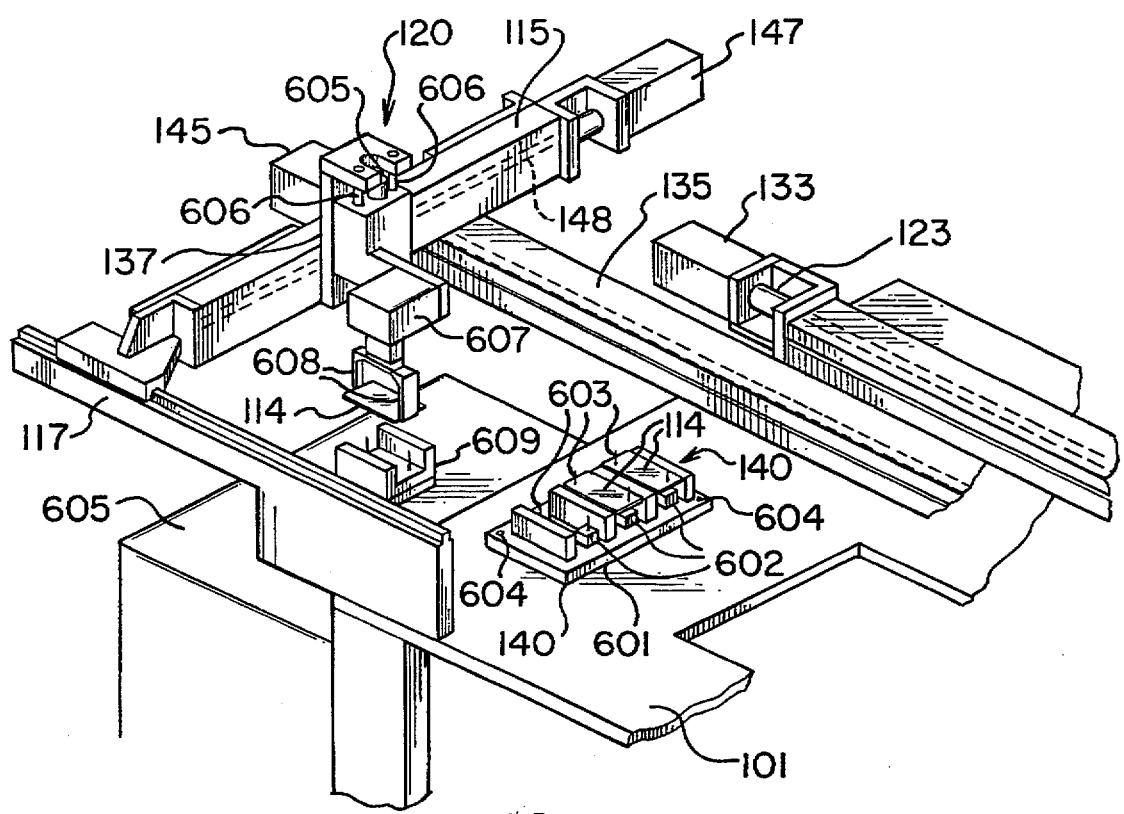
FIG. 6 is a perspective view of the registration area and registration arm assembly of the depanelling system.

Placement of PC boards 114 in registration nest 140 is described with respect to FIGS. 1 and 6. Depaneler arm assembly 119 is moved along guide 107, in response to signals from controller 121 to motor 133 as described above, until PC boards 114 are positioned over registration nest 140. Controller 121 sends signals to pneumatic cylinder 134 causing depaneler arm 105 to move downward in the Z axis.

Depaneler arm 105 is lowered until individual PC boards 114 contact their respective compartments in registration nest 140. As described above, locator pins 603 mate with holes 303 in PC boards 114 to precisely hold PC boards in registration nest 140. A sensor (not shown) in registration nest 140 sends a signal to controller 121 indicating the receipt of PC boards 114 by registration nest 140. Controller 121, in turn, sends a signal to the solenoids associated with fingers 106 to cause fingers 106 to release PC boards 114. PC boards 114 are now located in registration nest 140. Controller 121 sends signals to motor 133 to cause lead screw 123 to move depaneler assembly 119 back towards depanelling area 191 to begin operation on a second panel 111.

Registration Arm Assembly Operation

Operation of registration arm assembly 120 is described with respect to FIG. 6. PC boards 114 are now ready to be delivered one at a time from registration nest 140 to subsequent processing station 610. Registration arm assembly 120 comprises frame 115 which spans from track 117 to guide 135. Frame 115 is slidably mounted on track 117 and engages lead screw 146, as described below, which extends within guide 135 along the X axis. Registration arm support 137 is slidably connected to frame 115 and moves in the Y direction along frame 115 by the operation of motor 147 and lead screw 148. Motor 147 operates in response to signals from controller 121 to turn lead screw 148. Lead screw 148 engages registration arm support 137 so that registration arm support 137 is moved along frame 115 by the turning of lead screw 148. Frame 115 is moved in the X axis by the operation of motor 145 and lead screw 146. Motor 145 operates in response to signals from controller 121 to turn lead screw 146. Lead screw 146 moves frame 115 to move along guide 135 and track 117 in the X direction. A registration arm 607 moves in the Z axis when pneumatic cylinder 605, in response to signals from controller 121, moves registration arm 607 to move up and down on guides 606. Guides 606 are connected to registration arm support 137 and registration arm 607 is slidably connected to guides 606.

Controller 121 delivers signals as just described to move frame 115 along the X axis and to move registration arm support 137 in the Y axis. In this way, registration fingers 608 may be positioned over one of PC boards 114 in registration nest 140. In response to signals from controller 121, pneumatic cylinder 605 lowers registration arm 607 so that registration fingers 608 are positioned around one of PC boards 114 located in registration nest 140. Registration fingers 608 are closed by a solenoid (not shown) in response to signals from controller 121 to cause registration fingers 608 to grasp a single PC board 114. Pneumatic cylinder 605 responds to signals from controller 121 to lift registration arm 607 thereby lifting single PC board 114 from registration nest 140. Registration arm 607 is a rotary actuator operable to rotate a PC board 114 by as much as 180 degrees. It is apparent to those skilled in the art that registration arm 607 can be articulated so that, when grasped by registration fingers 608 and lifted from registration nest 140, PC board 114 can be rotated, turned on an edge so that the plane of PC board 114 is orthogonal to the plane of registration table 203, or even turned upside down. Articulation of registration arm 607 is accomplished through use of one or more motors (not shown) and/or pneumatic cylinders (not shown). Controller 121 sends signals to motors 145 and 147 in order to position the grasped PC board 114 in the X and Y axes. This is the state of depaneler system 100 depicted in FIG. 6. Through this operation, single PC board 114 is placed at subsequent location 610 as directed by controller 121. Controller 121 sends signals to the solenoid associated with registration fingers 608 to cause fingers 608 to open and release PC board 114 at subsequent processing station 610. Controller 121 communicates signals, as just described, to cause the remaining PC boards 114 in registration nest 140 to be moved from registration nest 140 to subsequent processing station 610. Subsequent processing station 610 has location 609. Location 609 may be a registered, known location with respect to the X, Y, and Z axes, as is depicted in FIG. 6, or it may be simply a moving conveyor belt or other unregistered location.

While registration arm assembly 120 is operating to move individual PC boards one at a time from registration nest 140 to subsequent processing station 610, the remainder of depaneler system 100 is processing another panel 111. Thus, when registration nest 140 has been cleared of PC boards 114 by the operation of registration arm assembly 120, depaneler arm assembly 119 delivers a new set of depanelled PC boards 114 to registration nest 140.

Board Verification Apparatus Operation

Figure 2:
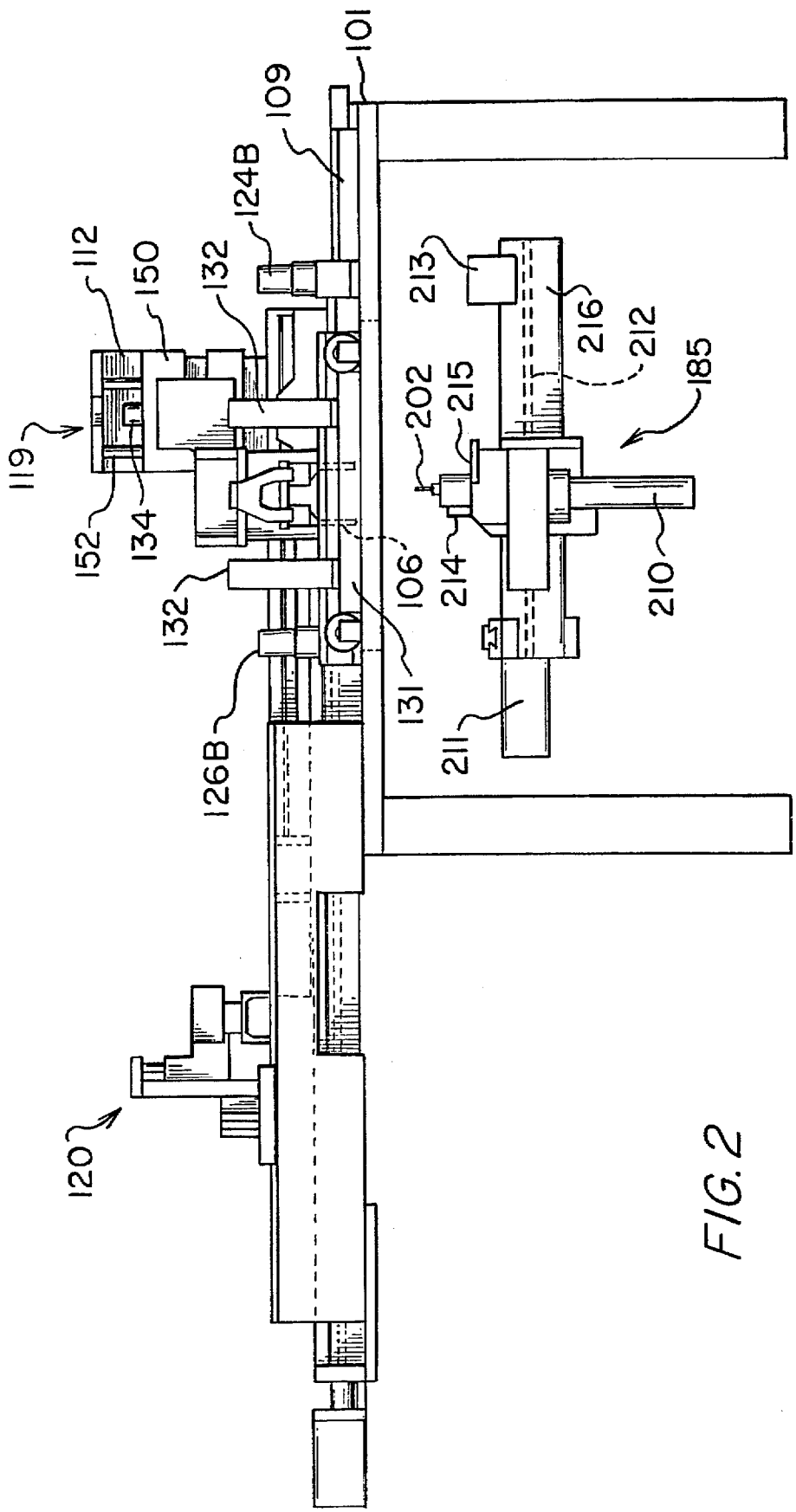
FIG. 2 depicts a side view of the depanelling system of FIG. 1.

With respect to FIG. 2, a further embodiment of the present invention is described. An optical sensor 214 is attached to router head assembly 215. Optical sensor 214 is used, when panel 111 is fixed between rails 130 and 131, to read the presence or absence of openings, markings, holes or other features on panel 111. In the preferred embodiment, a location on panel 111 can be checked by optical sensor 214 to ensure that panel 111 is in the proper orientation. A location on panel 111 or PC board 114 is selected so that, if panel 111 is in the proper orientation, it presents a particular feature, such as a hole, to optical sensor 214. Prior to initiation of the routing process, controller 121 sends signals to motors 211 and 213 to position optical sensor 214 to read the appropriate location on panel 111. If optical sensor 214 should sense a hole at the location on panel 111 if the board is properly oriented, but instead does not sense a hole, optical sensor 214 indicates to controller 121 that panel 111 is not in the proper orientation. The operation of depaneler system 100 can then be halted and a warning signal generated by controller 121 to alert the operator of a problem.

Another use of optical sensor 214 is to allow the automatic processing of different types of panels 111 on depaneler system 100. A type A of panel 111 is marked with a hole punched at a certain location. A type B of panel 111 is marked with no hole punched at the same certain location. When panel 111 is fixed between rails 130 and 131, optical sensor 214 is moved, responsive to signals from controller 121, to be immediately below the certain location on panel 111. If a type A board is sensed, i.e., a hole at the certain location, by optical sensor 214, then a first routing program is loaded by controller 121. If a type B board is sensed, i.e., no hole at the certain location, by optical sensor 214 then a second routing program is loaded by controller 121. The routing process is completed by signals from controller 121 using either the first routing program, if a Type A panel is in place, or the second routing program, if a Type B panel is in place. This allows for a great deal of flexibility in operation of depaneller system 100.

Still another application of optical sensor 214 is to screen out "bad" PC boards. If, during processing at a previous processing station (not shown) a PC board 114 within a panel is found to be defective, a hole is punched in a known location 306, shown in FIG. 3. When panel 111 is fixed between rails 130 and 131, and before the routing operation begins, router head 215 is moved to place optical sensor 214 immediately below each location 306 on each PC board 114. If no hole has been punched at location 306, the light of optical sensor 214 is reflected back to optical sensor 214 to generate, for example, a "good" signal which is communicated to controller 121. If a hole has been punched at location 306, such as hole 307 in PC board 114 depicted in FIG. 3, the light of optical sensor 214 is not reflected to optical sensor 214 and a "bad" signal is generated by optical sensor 214 and sent to controller 121. When the routing operation is performed, controller 121 communicates signals to router assembly 201 to cause router assembly 201 to skip the routing of PC boards 114 which were indicated to be "bad" by optical sensor 214. The "bad" PC board 114 is not separated from panel frame 304 and is, therefore, dropped into waste bin 501 after the completion of the routing process. In this way, depaneler system 100 can adjust its operation based on the information read by optical sensor 214. Location 306 on PC board 114 can be anywhere on PC board 114 or on frame 304. Since optical sensor 214 is mounted on router head 215, optical sensor 214 can be moved to sense any location on panel 111. Positions on panel 111 can be marked similarly to locations 306 on PC boards 114.

It is to be expressly understood that the claimed invention is not to be limited to the description of the preferred embodiment but encompasses other modifications and alterations within the scope and spirit of the inventive concept.

We claim:

1. Depaneling apparatus for processing a panel having an array of PC boards, comprising:

a table for receiving said panel;

means for positioning said panel in a predetermined position on said table;

controllably movable routing means for cutting each of said PC boards from said panel;

registration means;

means for moving each of said PC boards concurrently from said predetermined table position to said registration means, wherein said PC boards are held at a known location with respect to said registration means; and means for controllably delivering each of said PC boards one at a time from said registration means to a subsequent processing station.

2. The apparatus of claim 1 wherein said means for moving each of said PC boards concurrently from said predetermined table position to said registration means, comprises:

a depaneller arm operable to move in at least 2 axes; and means of said depaneller arm for supporting said PC boards as said PC boards are removed from said panel and for maintaining registration between said PC boards and said depaneller arm as said depaneller arm moves said PC boards to said registration means.

3. The apparatus of claim 2, wherein different ones of said PC boards present different physical features, said depaneller arm further comprising:

configuration means attached to said depaneller arm wherein said configuration means can be interchanged with a second configuration means in order to accommodate said different features and thus support different ones of said PC boards.

4. The apparatus of claim 1 wherein said means for controllably delivering each of said PC boards one at a time from said registration means to said subsequent processing station comprises:

a registration arm;

means for grasping one of said PC boards with said registration arm; and controlling means for said registration arm to transport said PC boards one at a time to said subsequent processing station.

5. The apparatus of claim 4, wherein different ones of said PC boards present different physical features, said registration arm further comprising:

configuration means attached to said registration arm wherein said configuration means can be interchanged with a second configuration means in order to accommodate said different physical features and thus support said different PC boards.

6. The apparatus of claim 4 wherein said registration arm comprises:

means for moving said registration arm in three or more axes to establish registration with each of said PC boards with respect to said registration arm and move each of said PC boards one at a time to said subsequent processing station.

7. The apparatus of claim 4 wherein said controlling means for said registration arm comprises:

selection means for selecting one of said subsequent processing stations from a group of at least two of said subsequent processing stations wherein each of said subsequent processing stations is at a different location from the other of said subsequent processing stations; and said controlling means being operable for directing said registration arm to transport one said PC board to said selected subsequent processing station.

8. The apparatus of claim 4 wherein said controlling means for said registration arm comprises:

an input means for receiving an indication signal when said subsequent processing station is available to receive said PC board from said registration arm; and said controlling means being responsive to said indication signal from said input means to initiate operation of said delivery arm to transport one of said boards to said utilization means.

9. The apparatus of claim 1 wherein said routing means is controllably movable in three axes with respect to said panel when said panel is positioned at said predetermined position.

10. The apparatus of claim 9 wherein said routing means comprises:

a sensor attached to said router means for sensing a panel indicia, said panel indicia being representative of a characteristic of said panel; and router control means responsive to a signal from said sensor operable to control the operation of said router means.

11. The apparatus of claim 10 wherein said sensor means comprises:

a fiber optic sensor;

said fiber optic sensor provides a first signal in response to a first panel characteristic and a second signal in response to a second panel characteristic; and said control means operates said routing means according to a first routing program in response to said first signal and operates said routing means according to a second routing program in response to said second signal.

12. The apparatus of claim 1 wherein said registration means comprises:
 a registration nest comprising a site for each of said PC boards of a panel;
 each said site comprising a locating means operable to register one said PC board with respect to said registration nest.

13. The apparatus of claim 12 wherein said locating means comprises;
 at least one locator pin positioned to insert through a hole in said PC board when said PC board is placed in said site of said registration nest by said depaneller arm; and
 said PC board is thereby registered on said registration nest.

14. The apparatus of claim 1 wherein said table comprises:
 a fixed rail;
 a movable rail; and
 said fixed rail and said movable rail being operable to be spaced apart at a first distance to accept and hold said panel during depaneling and be spaced apart at a second distance after depaneling to allow said panel to drop between said fixed rail and said movable rail.

15. A method for depaneling a panel having an array of PC boards, comprising the steps of:
 receiving said panel on a table;
 positioning said panel in a predetermined position on said table;
 controllably positioning a movable routing means with respect to said predetermined position of said table to cut each of said PC boards from said panel;
 moving each of said PC boards concurrently from said predetermined table position to a registration means;
 maintaining a known location of said PC boards with respect to said registration means; and
 controllably delivering each of said PC boards one at a time from said registration means to a subsequent processing station.

16. The method of claim 15 wherein said step of moving each of said PC boards concurrently from said predetermined table position to said registration means, comprises the steps of:
 supporting said PC boards with a depaneller arm as said PC boards are removed from said panel; and
 maintaining registration between said PC boards and said depaneller arm as said depaneller arm moves said PC boards to said registration means.

17. The method of claim 15, wherein said step of controllably delivering each of said PC boards one at a time from said registration means to said subsequent processing station comprises the steps of:

registering one of said PC boards with respect to a registration arm; and
 controlling said registration arm to transport said PC boards one at a time to said subsequent processing station.

18. The method of claim 17 wherein said step of registering one of said PC boards with said registration arm comprises:
 moving said registration arm in three axes or more to establish registration with one of said PC boards with respect to said registration arm; and
 transporting one of said PC boards one at a time to said subsequent processing station.

19. The method of claim 17 wherein the step of controlling said registration arm comprises the steps of:
 selecting one subsequent processing station from a group of at least two of said subsequent processing stations wherein each of said subsequent processing stations is at a different location from the other of said subsequent processing stations; and
 operating said registration arm to transport one said PC board to said selected subsequent processing station.

20. The method of claim 17 wherein step of controlling said registration arm further comprises the steps of:
 receiving an indication signal when said subsequent processing station is available to receive said PC board from said registration arm; and
 operating said registration arm to transport one of said PC boards to said subsequent processing station.

21. The method of claim 15 wherein said step of controllably positioning said routing means comprises the step of:
 controllably moving said routing means in three axes with respect to said panel when said panel is positioned at said predetermined position on said table.

22. The method of claim 15 further comprising steps of:
 sensing a panel indicia representative of a characteristic of said panel,
 generating an indication signal representative of a characteristic of said panel,
 controlling the operation of said router means in response to said indication signal.

23. The method of claim 15 wherein said step of positioning said panel in a predetermined position on said table comprises the steps of:
 spacing a fixed rail and a movable rail at a first distance to hold said panel; and
 moving said movable rail to a second distance from said fixed rail to cause said panel to drop between said fixed rail and said movable rail.

* * * * *